US006771552B2

(12) United States Patent
Fujisawa (10) Patent No.: US 6,771,552 B2
(45) Date of Patent: Aug. 3, 2004

(54) SEMICONDUCTOR MEMORY DEVICE AND CONTROL METHOD (75) Inventor: Hiroki Fujisawa, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/372,604

(22) Filed: Feb. 21, 2003

(65) Prior Publication Data
US 2003/0156481 A1 Aug. 21, 2003

(30) Foreign Application Priority Data
Feb. 21, 2002 (JP) ........................................ 2002-044676

(51) Int. Cl.[7] .............................................. G11C 7/00
(52) U.S. Cl. ................... 365/221; 365/189.01; 365/233
(58) Field of Search ................................. 365/221, 220, 365/189.01, 189.04, 193, 233, 230.06, 239

(56) References Cited

U.S. PATENT DOCUMENTS 5,255,238 A  * 10/1993  Ichige et al. ................ 365/220
5,426,612 A  *  6/1995  Ichige et al. ................ 365/220
6,374,313 B1 *  4/2002  Popat .......................... 710/52

FOREIGN PATENT DOCUMENTS

JP     2000-339957    12/2000    ......... G11C/11/407
JP     2001-236782     8/2001    ......... G11C/11/407

* cited by examiner

Primary Examiner—Gene N. Auduong
(74) Attorney, Agent, or Firm—Hayes Soloway P.C.

(57) ABSTRACT

In a semiconductor memory device in which a system clock that is supplied from the outside and a data strobe signal that is received as input and supplied as output in synchronization with data are used to control operations for reading and writing data, the transmission of write data from FIFO memories to write amplifiers is controlled by the data strobe signal. In addition, switches for connecting write amplifiers with bit lines that are linked to memory cells that correspond to addresses to which write data are to be written are driven without delaying with respect to a timing signal that is synchronized with the system clock. Write data that have been received as burst input are transmitted in parallel from the FIFO memories to the write amplifiers in units of the prefetch number.

6 Claims, 9 Drawing Sheets

SEMICONDUCTOR MEMORY DEVICE AND CONTROL METHOD

BACKGROUND OF THE INVENTION

1. Field of the Invention

The present invention relates to a semiconductor memory device, and more particularly to a DDR (Double Data Rate) SDRAM (Synchronous DRAM).

2. Description of the Related Art

In DDR-SDRAM, a system clock CLK supplied from the outside and a data strobe (hereinbelow abbreviated as "DQS") signal that is received as input and supplied as output in synchronization with transfer data are used to control data writing and data reading operations.

The DQS signal is a serial pulse signal of the same period as system clock CLK in which the skew with system clock CLK and the pulse width are prescribed by the standards of JEDEC (Joint Electron Device Engineering Council).

The first to third prior-art examples described below are known methods of using this system clock CLK and DQS signal to control data writing and data reading operations.

3. First Example of the Prior Art

Figure 1:
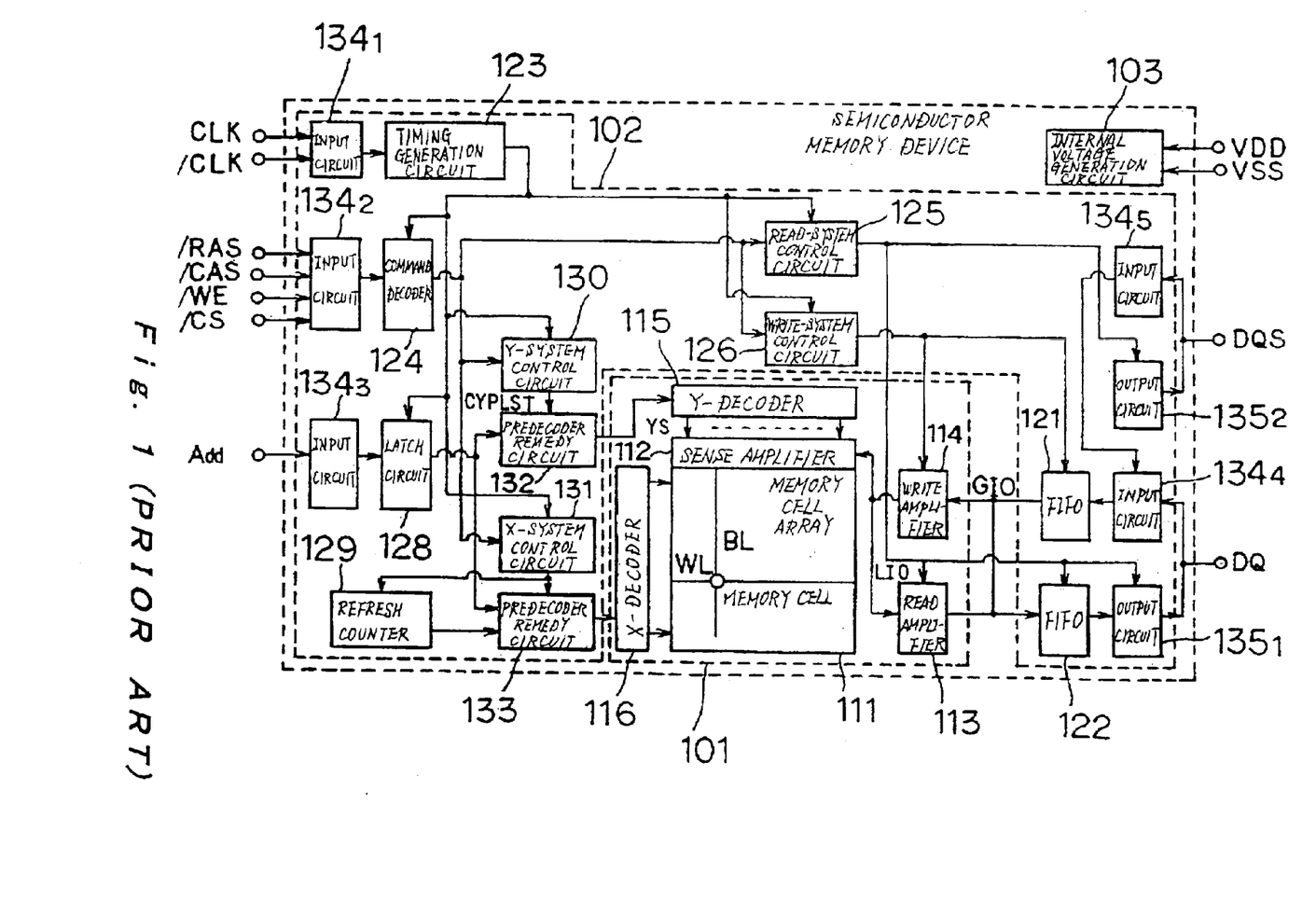
FIG. 1 is a block diagram showing the construction of the semiconductor memory device of the first example of the prior art.

We next refer to FIG. 1, which is a block diagram showing the construction of the semiconductor memory device of the first prior-art example.

As shown in FIG. 1, the semiconductor memory device of the first example of the prior art is a construction that includes: memory unit 101 in which data are stored, peripheral circuit unit 102 for controlling the operations of writing data to and reading data from memory unit 101, and internal voltage generation circuit 103 for generating various power supply voltages that are supplied to memory unit 101 and peripheral circuit unit 102.

Memory unit 101 is provided with: memory cell array 111 that is constructed from a plurality of memory cells that are arranged in a lattice form, sense amplifier 112 and read amplifier 113 for reading data that are stored in memory cells, write amplifier 114 for writing data to memory cells, and Y-decoder 115 and X-decoder 116 for decoding address signals that are used for accessing memory cells in which data are written or read. Sense amplifier 112 is provided with switches (not shown in the figures) for connecting write amplifier 114 and read amplifier 113 to each of the bit lines BL of memory cell array 111.

Peripheral circuit unit 102 is a construction that includes: FIFO memory 121 for temporarily holding write data, which are data that are the object of writing that are applied as input to write amplifier 114; FIFO memory 122 for temporarily holding read data, which are data that are the object of reading and that are supplied as output from read amplifier 113; timing generation circuit 123 for generating, from system clock CLK that is supplied from the outside, various timing signals for causing the semiconductor memory device to operate at prescribed timings; command decoder 124 for decoding various control commands that are supplied from the outside for setting the semiconductor memory device to prescribed operation modes; read-system control circuit 125 for controlling the operations of reading data from memory cell array 111 in accordance with the output signals of timing generation circuit 123 and command decoder 124; write-system control circuit 126 for controlling the operations of writing data to memory cell array 111 in accordance with the output signals of timing generation circuit 123 and command decoder 124; latch circuit 128 for temporarily holding address signals that are supplied from the outside; refresh counter 129 for controlling the refresh operation; Y-system control circuit 130 for controlling the operations of accessing the Y-(column-) system of memory cell array 111 in accordance with the output signals of timing generation circuit 123 and command decoder 124; X-system control circuit 131 for controlling the operations of accessing the X-(row-) system of memory cell array 111 in accordance with the output signals of timing generation circuit 123 and command decoder 124; predecoder remedy circuit 132 that is used in the Y-system when a defect occurs in a memory cell for switching the defective memory cell to a spare memory cell; and predecoder remedy circuit 133 that is used in the X-system when a defect occurs in a memory cell for switching the defective memory cell to a spare memory cell.

Input circuits $134_1$–$134_3$ are buffer circuits by way of which system clock CLK (/CLK), control commands (such as /RAS, /CAS, /WE, and /CS), and address signals Add, respectively, are supplied to peripheral circuit unit 102. Data (write data) that are written to memory cell array 111 are supplied to FIFO memory 121 by way of input circuit $134_4$, and data that are read from memory cell array 111 are supplied to the outside by way of output circuit $135_1$, which is a buffer circuit. Similarly, the DQS signal that is supplied from the outside is supplied to peripheral circuit unit 102 by way of input circuit $134_5$, and the DQS signal that is generated at read-system control circuit 125 is fed to the outside by way of output circuit $135_2$.

DDR-SDRAM is a prefetch memory for collecting write data that are held in a plurality of FIFO memories and transferring the data to write amplifiers. When, for example, the burst length is 4 and the prefetch number is 4 in such a prefetch memory, four items of write data are successively received as input with every write command, and the four items of write data are collected and transmitted from a FIFO memory to a write amplifier. Alternatively, when the burst length is 8 and the prefetch number is 4, eight items of write data are successively received as input for every write command, collected for every four items of write data (in units of the prefetch number), and transmitted from a FIFO memory to a write amplifier.

Thus, although not shown in FIG. 1, FIFO memories 121 and 122 are provided in a number that equal to the bits of write data and read data (such as 8, 16, or 32 bits), and write amplifiers 114 and read amplifiers 113 are provided in a number equal to the prefetch number (such as 2 or 4) for each of the bits of write data and read data. Consequently, FIFO memories 121 and 122 and write amplifiers 114 and read amplifiers 113 are each connected by GIO lines that are equal in number to the product of the number of bits of write data and read data and the prefetch number. Further, write amplifiers 114, read amplifiers 113, and memory cell array 111 are connected by LIO lines that are equal in number to the product of the number of bits of write data and read data and the prefetch number.

Figure 2:
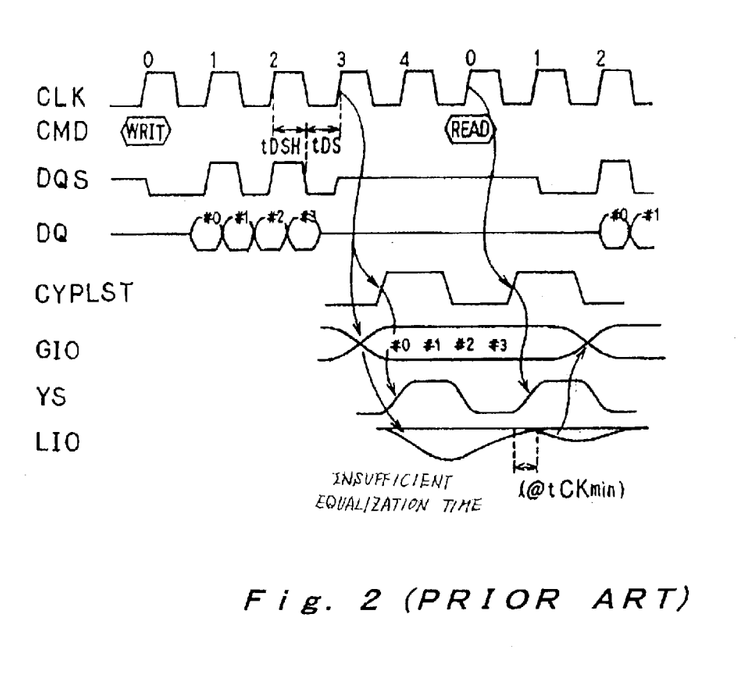
FIG. 2 is a timing chart showing the operation of the semiconductor memory device that is shown in FIG. 1.

We next refer to the timing chart of FIG. 2 to explain the operations of writing and reading data of the semiconductor memory device of the first prior-art example shown in FIG. 1. FIG. 2 shows data writing and reading operations in which the write latency is 1, the read latency is 2, the burst length is 4, and the prefetch number is 4.

The semiconductor memory device of the first prior-art example is a construction in which the operations of writing data to and reading data from memory cell array 111 are all controlled by synchronizing with system clock CLK.

As shown in FIG. 2, when data are written to the semiconductor memory device of the first prior-art example, the plurality of items of write data (DQ) that are successively received in synchronization with each rising edge and falling edge of the DQS signal are both converted to parallel data and temporarily held by FIFO memory 121. The data are then transferred (GIO) to write amplifier 114 in synchronization with the rising edge of the first system clock CLK (CLK=3) following completion of data input (of the prefetch number of items of data). GIO in FIG. 2 shows the state when write data #0–#3 are transmitted in parallel.

When the semiconductor memory device is set to write mode (WRIT) by a control command from the outside, a write command instructing the writing of data that is generated at command decoder 124 is supplied to Y-system control circuit 130. In addition, a timing signal that is generated by timing generation circuit 123 is supplied to Y-system control circuit 130 at the rising edge of system clock CLK (CLK=3 in FIG. 2) that is the same as the timing of transmission of write data to the above-described write amplifier 114.

In order to connect bit lines BL and write amplifiers 114 that correspond to the write addresses, Y-system control circuit 130 supplies control signal CYPLST as output for controlling the switches included in sense amplifier 112 (not shown in the figure) based on the above-described timing signal. Control signal CYPLST is delayed a prescribed time interval from the input of the timing signal and then supplied as output. Control signal CYPLST is also used in the predecoding process and a defective memory cell remedy process at predecoder remedy circuit 132.

In accordance with control signal CYPLST that is transmitted from Y-system control circuit 130 by way of predecoder remedy circuit 132, Y-decoder 115 supplies activation signal YS as output for turning on each of the switches in sense amplifier 112 that correspond to the results of decoding the write addresses.

Based on write data that are transmitted from FIFO memory 121, write amplifier 114 supplies the write voltage (LIO), which is the voltage necessary for writing data to memory cells, in synchronization with the control signal that are generated at write system control circuit 126. The write voltage that is supplied from write amplifier 114 is supplied to each of bit lines BL in memory cell array 111 by way of switches in sense amplifier 112, and the write data are written to respective memory cells that correspond to the decoding results.

On the other hand, when data are read from the semiconductor memory device of the first prior-art example, upon setting of the semiconductor memory device to the read mode (READ) by means of a control command from the outside, a read command that instructs reading of data that is generated at command decoder 124 and a timing signal that is generated at timing generation circuit 123 are each supplied to Y-system control circuit 130 at the rising edge of system clock CLK.

In order to connect read amplifiers 113 that correspond to the read addresses to bit lines BL, Y-system control circuit 130 supplies control signal CYPLST as output for controlling switches (not shown in the figures) included in sense amplifier 112 based on the above-described timing signal. Control signal CYPLST is delayed a prescribed time interval from the input of the timing signal and then supplied as output.

In accordance with control signal CYPLST that is transmitted from Y-system control circuit 130 by way of predecoder remedy circuit 132, Y-decoder 115 supplies activation signal YS as output for turning on each of the switches in sense amplifier 112 that correspond to the results of decoding the read address.

Read amplifier 113, in synchronization with the control signal that is generated at read-system control circuit 125, reads each item of data in memory cell array 111 that is detected by sense amplifier 112 and transmits the read data to FIFO memory 122. FIFO memory 122 supplies the read data that have been transmitted from read amplifier 113 to the outside from output terminal DQ by way of output circuit 1351.

Second Prior-Art Example

Figure 3:
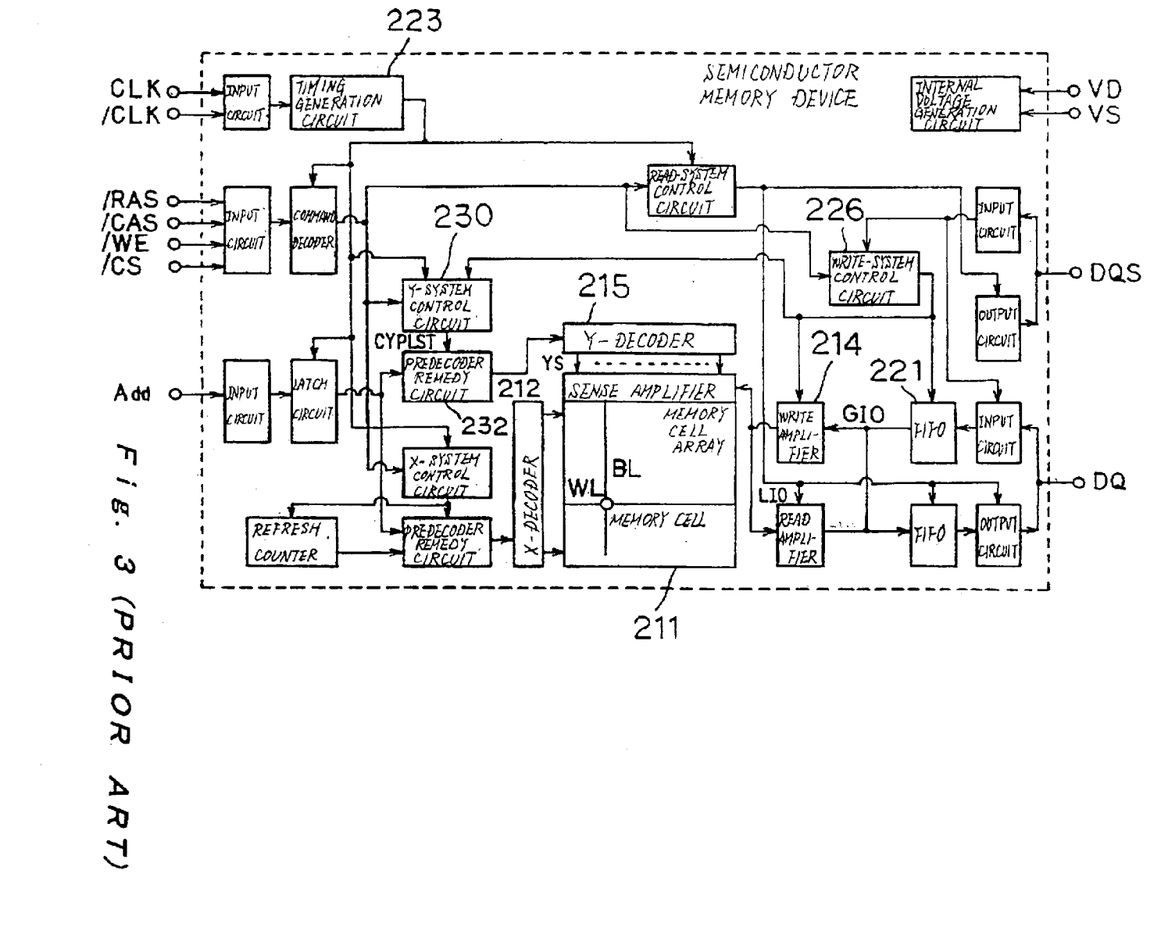
FIG. 3 is a block diagram showing the construction of the semiconductor memory device of the second example of the prior art.

We next refer to FIG. 3, which is a block diagram showing the construction of the semiconductor memory device of the second prior-art example.

As shown in FIG. 3, the semiconductor memory device of the second prior-art example differs from the semiconductor memory device of the first prior-art example in that a DQS signal is supplied to write-system control circuit 226, and each of FIFO memory 221 that temporarily holds the write data, write amplifier 214, and Y-system control circuit 230 is controlled by the output signal of write-system control circuit 226. The construction of this example is otherwise equivalent to that of the first prior-art example, and explanation of these similar points is therefore here omitted.

Figure 4:
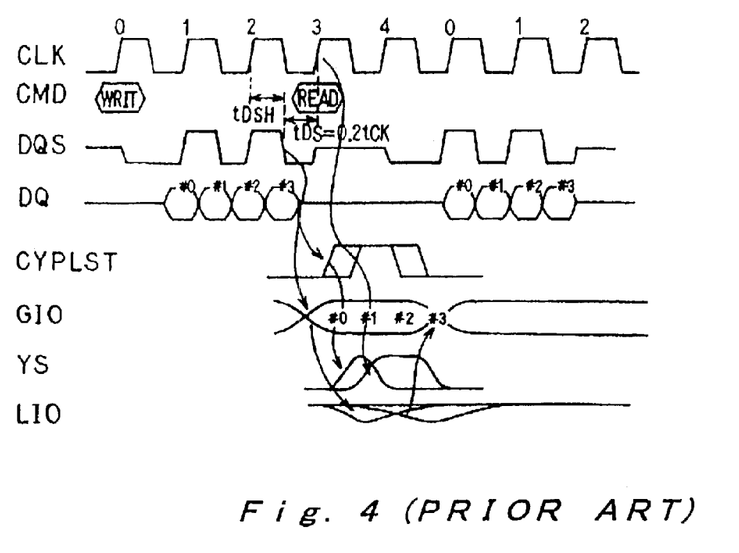
FIG. 4 is a timing chart showing the operation of the semiconductor memory device that is shown in FIG. 3.

FIG. 4 is a timing chart showing the operation of the semiconductor memory device shown in FIG. 3. As with FIG. 2, FIG. 4 shows operations of writing and reading data in which the write latency is 1, the read latency is 2, the burst length is 4 and the prefetch number is 4.

The semiconductor memory device of the second prior-art example is a construction that controls all operations of writing data to a memory unit in synchronization with the DQS signal and that controls all operations of reading data in synchronization with system clock CLK.

As shown in FIG. 4, when data are written in the semiconductor memory device of the second prior-art example, the plurality of items of write data (DQ) that are successively received as input in synchronization with each of the rising edge and the falling edge of the DQS signal are both converted to parallel data and temporarily held in FIFO memory 221. The data are then transmitted (GIO) to write amplifier 224 in units of the prefetch number in synchronization with the falling edge of the DQS signal that is received as input together with the final item of write data of each prefetch number of items. The state of the GIO shown in FIG. 4 is for a case in which write data #0–#3 are transmitted in parallel.

When the semiconductor memory device is set to the write mode (WRIT) by a control command from the outside, a write command that instructs data writing and that is generated at command decoder is supplied to Y-system control circuit 230. In addition, a timing signal that is generated by timing generation circuit 223 is supplied to Y-system control circuit 230 at the falling edge of the same DQS signal as the above-described timing of transfer of the write data to write amplifier 214. In order to connect write amplifier 214 that corresponds to the write address to bit lines BL, Y-system control circuit 230 supplies control signal CYPLST as output for controlling switches (not shown in the figure) that are included in sense amplifier 212 based on the above-described timing signal. Control signal CYPLST is delayed by a prescribed time interval from the input of the timing signal and then supplied as output. Control signal CYPLST is further used in the predecoding process and the defective memory cell remedy process at predecoder remedy circuit 232.

In accordance with control signal CYPLST that has been transmitted from Y-system control circuit 230 by way of predecoder remedy circuit 232, Y-decoder 215 supplies activation signal YS as output for turning on each of the switches in sense amplifier 212 that correspond to the results of decoding the write address.

At this time, based on write data that are transmitted from FIFO memory 221, write amplifier 214 supplies as output (LIO) a write voltage, which is the voltage that is necessary for writing data to the memory cells, in synchronization with a control signal that is generated at write-system control circuit 226. The write voltage that is supplied from write amplifier 214 is supplied by way of the switches in sense amplifier 212 to each of bit lines BL in memory cell array 211, and write data are written to the memory cells that correspond to the results of decoding.

The reading of data from the semiconductor memory device of the second prior-art example is controlled in synchronization with system clock CLK as in the first prior-art example, and explanation of this process is therefore here omitted.

Third Prior-Art Example

Figure 5:
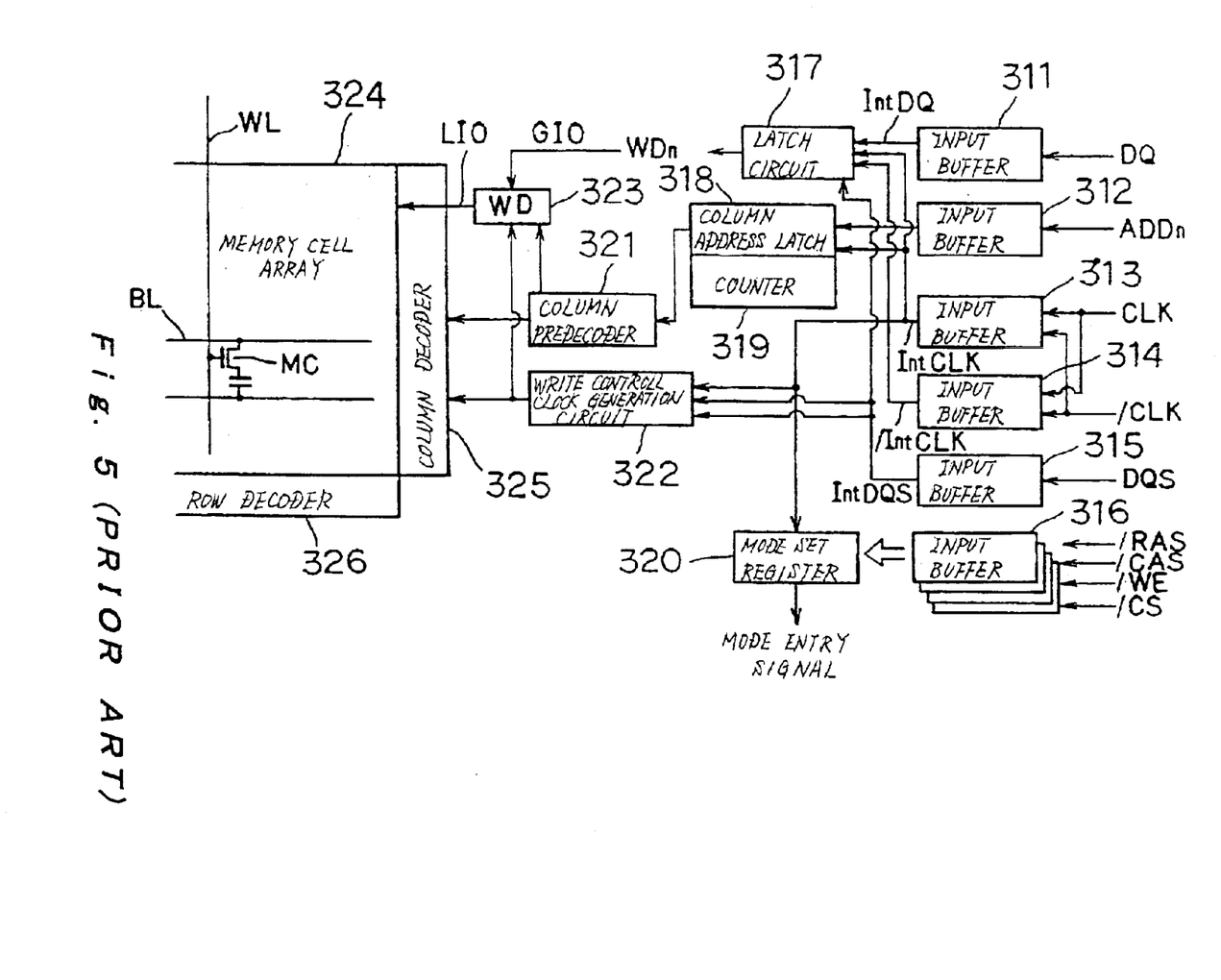
FIG. 5 is a block diagram showing the construction of the semiconductor memory device of the third example of the prior art.

We next refer to FIG. 5, which is a block diagram showing the configuration of the semiconductor memory device of the third prior-art example. The semiconductor memory device of the third prior-art example shown in FIG. 5 is a construction that is described in Japanese Patent Laid-Open No. 339957/2000.

As shown in FIG. 5, the semiconductor memory device of the third prior-art example is a construction that includes: input buffers 311–316, latch circuit 317, column address latch 318, counter 319, mode set register 320, column predecoder 321, write control clock generation circuit 322, write driver (WD) 323, memory cell array 324, column decoder 325, and row decoder 326.

Input buffers 311–316 correspond to the input circuits of the first and second prior-art examples, latch circuit 317 corresponds to the FIFO memories of the first and second prior-art examples, and column address latch 318 and counter 319 correspond to the latch circuit of the first and second prior-art examples. In addition, mode setting register 320 corresponds to the command decoder of the first and second prior-art examples, column predecoder 321 corresponds to the predecoder remedy circuit of the first and second prior-art examples, and write control clock generation circuit 322 corresponds to the write-system control circuit. Further, write driver (WD) 323 corresponds to the write amplifier of the first and second prior-art examples, column decoder 325 corresponds to the Y-decoder of the first and second prior-art examples, and row decoder 326 corresponds to the X-decoder of the first and second prior-art examples. Accordingly, explanation regarding the details of these constructions is here omitted.

Figure 6:
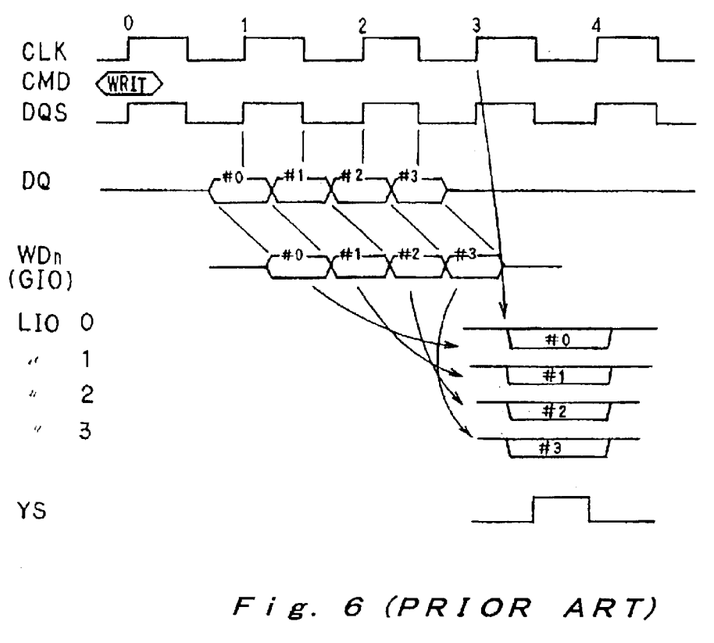
FIG. 6 is a timing chart showing the operation of the semiconductor memory device that is shown in FIG. 5.

We next refer to the timing chart of FIG. 6 to explain the operations of writing data in the semiconductor memory device of the third prior-art example that is shown in FIG. 5. FIG. 6 shows the operations for writing and reading data in which the write latency is 1, the read latency is 2, the burst length is 4, and the prefetch number is 4. In addition, of the operations for writing data in the above-described Japanese Patent Laid-Open No. 339957/2000, the operations by which a plurality of items of write data are supplied in parallel as output from write driver 323 and the operations for driving each of the switches in the sense amplifier are not described, but since these operations are techniques known to anyone knowledgeable in the art, the following explanation will proceed on the assumption that these operations are known techniques. In addition, no disclosure is made regarding the operations for reading data in Japanese Patent Laid-Open No. 339957/2000, and such explanation is therefore omitted hereinbelow.

The semiconductor memory device of the third prior-art example is a construction in which write data that are held by latch circuit 317 are successively transmitted to write driver 323 in synchronization with the DQS signal at the time of burst input, and in which the transfer of data from write driver 323 to memory cell array 324 is controlled by system clock CLK.

As shown in FIG. 6, when data are written to the semiconductor memory device of the third prior-art example, write data (DQ) that are received from the outside are first accepted in latch circuit 317, following which the write data (DQ) are successively transferred (WDn, which corresponds to GIO of the first and second prior-art examples) to write driver 323 in synchronization with the rising edge and the falling edge of the DQS signal at the time of burst input.

When the semiconductor memory device is set to the write mode (WRIT) by a control command from the outside, a write command that instructs writing of data is generated at mode setting register 320 and supplied to column decoder 325. Based on a timing signal that is generated from system clock CLK, column decoder 325 supplies activation signal YS as output for turning on each of the switches in the sense amplifier (not shown in the figure) that correspond to the results of decoding the write address.

At this time, write driver 323 supplies as output (LIO) write voltage, which is the voltage required for writing data to memory cells, in parallel to each item of write data in synchronization with a control signal that is generated at write control clock generation circuit 322 based on a plurality of items of write data that are transmitted from latch circuit 317. The write voltage that is supplied from write driver 323 is supplied to each bit line BL in memory cell array 324 by way of switches in the sense amplifier (not shown in the figure) and the write data are written to the memory cells MC that correspond to the decoding results.

As described in the foregoing explanation, of the semiconductor memory devices of the prior art, the semiconductor memory device of the first prior-art example controls all of the operations for writing and reading data in synchronization with system clock CLK, and the potential for malfunctions caused by fluctuations in timing is therefore limited and reliable operation can be expected.

Nevertheless, the semiconductor memory device of the first prior-art example has the problem that higher speeds of the operations for writing or reading data can only be achieved by increasing the speed of each of the constituent elements or by reducing the capacitance of the wiring. In recent years, the advance toward higher speeds in CPUs in systems that include semiconductor memory devices means that the processing speed of the system is now controlled by the access time to the semiconductor memory device. Higher speed of the operations for writing and reading data has now become the key performance that is demanded of semiconductor memory devices.

In contrast, in the semiconductor memory device of the second prior-art example, write data are transmitted from the FIFO memory to a write amplifier in synchronization with the falling edge of the DQS signal that is received as input together with, of the write data that are received in a burst for a single write command, the final item of write data of every prefetch number of items, and as a result, write data can be transmitted from the FIFO memory to a write amplifier at a speed that is tDS (tDS being the setup time of the DQS signal with respect to system clock CLK; refer to FIGS. 2 and 4) sooner than in the semiconductor memory device of first prior-art example.

Nevertheless, as previously described, the DQS signal is prescribed in the JEDEC standards prescribe only by the skew of the DQS signal with system clock CLK (this skew being tDS/tDSH; refer to FIGS. 2 and 4) and the pulse width, and thus cases may occur in which the period of the DQS signal differs from that of system clock CLK. In such cases, the pulse width of activation signal YS that is supplied as output from the Y-decoder may fall below the minimum operating clock rate tCKmin of the semiconductor memory device, whereby the equalization time of the LIO lines (to be described hereinbelow) can no longer be guaranteed.

If, moreover, the mode is switched to the read mode (READ) immediately after having received the prefetch number of items of write data as shown in FIG. 4 in the semiconductor memory device of the second prior-art example, since the write data have already been transmitted from the FIFO memory to the write amplifier, failure to halt the output of activation signal YS that was generated by means of the write command will result in a multi-operation in which the data writing operation and data reading operation are executed at the same time. The output of activation signal YS must be halted within tDS shown in FIG. 4, but the difficulty of implementing control by which a read command that is generated in synchronization with system clock CLK is used to halt within tDS activation signal YS that is generated in synchronization with the DQS signal may result in collision between the control signals for writing data and the control signals for reading data.

The semiconductor memory device of the third prior-art example is an example of a construction that has been proposed for solving the problems of the above-described first and second prior-art examples, this device being a construction in which, as with the semiconductor memory device of the second prior-art example, write data are transmitted from a latch circuit (FIFO memory) to a word driver (write amplifier) in synchronization with the DQS signal, and, as in the first prior-art example, the output timing of activation signal YS and write data from the word driver is synchronized with system clock CLK. Adopting this construction both achieves the high-speed transmission of write data to the word driver and prevents malfunction caused by fluctuation in the period of the DQS signal.

Nevertheless, as shown in FIG. 6, write data are successively transmitted to the write amplifier in synchronization with the DQS signal at the time of burst input in the semiconductor memory device of the third prior-art example, and as a result, write data cannot be transmitted from the FIFO memory to the write amplifier in semiconductor memory devices of recent years in which the frequency of the system clock CLK is high.

Normally, the write amplifier is arranged close to the memory cell array and the FIFO memory is arranged close to the input/output terminals, and the interconnects between the write amplifier and the FIFO memory (GIO lines) are therefore extremely long. Of the lines within a semiconductor memory device, the GIO lines are the lines that bear the heaviest load, and it is therefore difficult to transmit data through these GIO lines in synchronization with a high-speed clock. In the semiconductor memory device of the third prior-art example, there is the further problem that the plurality of items of write data that are received in a series (serial data) must be converted to parallel data at the output of the write amplifier, resulting in the increased circuit scale of the write amplifier.

Furthermore, semiconductor memory devices such as DDR-SDRAM typically necessitate sufficient securing of equalization time of the LIO lines described below.

In semiconductor memory devices in recent years, the scale of the memory cell array (number of bits) has increased together with the increase in storage capacity, whereby the wiring length and load of the LIO lines that connect the bit lines with read amplifiers and write amplifiers have increased, and the rise time and the fall time therefore tend to lengthen when driving the LIO lines. The minimum operation clock rate tCKmin of a semiconductor memory device depends on the equalization time for the potential of LIO lines that has shifted due to write data to return to its original state. When, for example, the mode switches to the read mode after write data have been received as input as shown in FIG. 2 and data are read before the potential of the LIO lines, which has been displaced due to the write data, has returned to its original state, the potential remaining in the LIO lines prevents the voltage that is detected by the sense amplifier from being determined as correct data at the read amplifier. Thus, when a transition to a read operation occurs immediately after a write operation, sufficient equalization time of the LIO lines must be secured.

SUMMARY OF THE INVENTION

It is an object of the present invention to provide a semiconductor memory device that achieves data writing operations at high speeds and a method of controlling the semiconductor memory device.

To achieve the above-described object, the transmission of write data from a FIFO memory to a write amplifier in the semiconductor memory device of the present invention is controlled by a data strobe signal. Accordingly, write data can be transmitted to a write amplifier at a speed that is faster by a degree equal to the setup time of the data strobe signal to the system clock.

In addition, switches for connecting write amplifiers with bit lines that are linked to memory cells that correspond to addresses for writing write data in the semiconductor memory device of the present invention are driven without being delayed with respect to a timing signal that is synchronized with the system clock. In this type of construction, sufficient equalization time can be secured for the LIO lines that connect the write amplifier and memory cells after data writing, and as a result, data can be written at higher speed than in a semiconductor memory device of the prior art.

In the semiconductor memory device of the present invention, the processing of write commands and read commands are each controlled in synchronization with the system clock, and as a result, drive signals of the above-described switches that are supplied based on a write command can easily be halted by a read command even when the transition to a data reading operation occurs immediately after a data writing operation. Collisions will therefore not occur between control signals for data writing and control signals for data reading, and data can be read reliably.

Further, write data that have been received as burst input in the semiconductor memory device of the present invention are transmitted in parallel from the FIFO memory to write amplifiers in units of the prefetch number. In this type of construction, write data can be reliably transmitted to write amplifiers even when the frequency of the system clock is high, and as a result, malfunctioning and destruction of write data when writing data can be prevented.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 7:
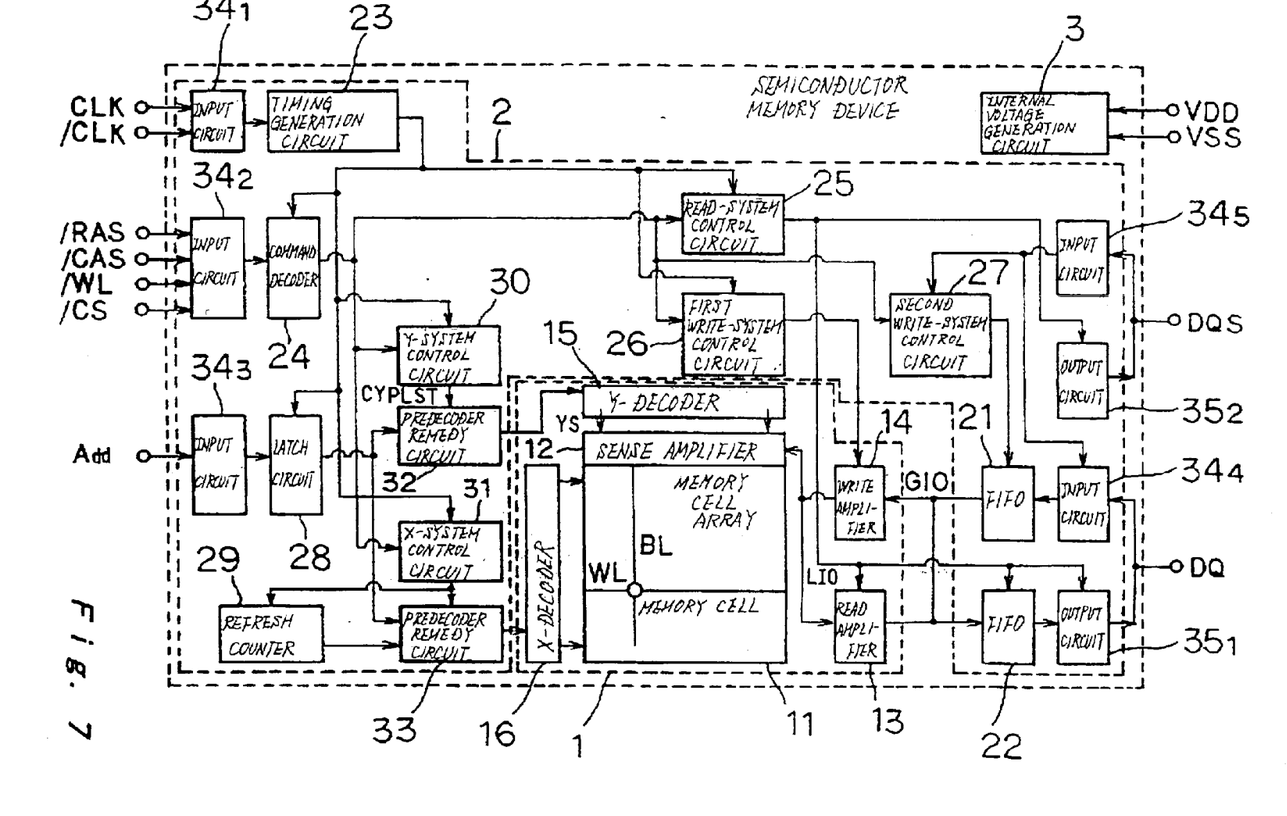
FIG. 7 is a block diagram showing an example of the construction of the semiconductor memory device of the present invention.
Figure 8:
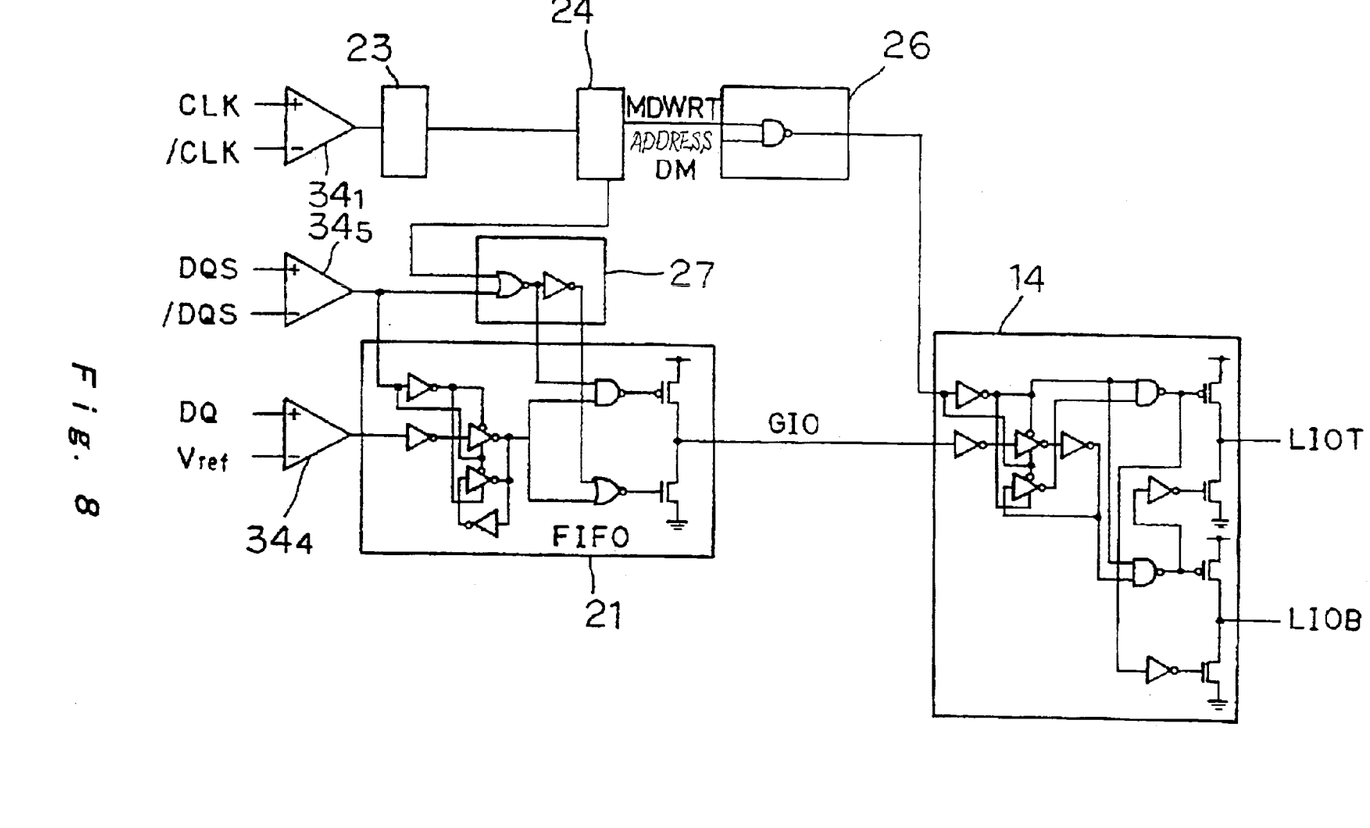
FIG. 8 is a circuit diagram showing an example of the configuration of the first write-system control circuit, the second write-system control circuit, and the write amplifier that are shown in FIG. 7.
Figure 9:
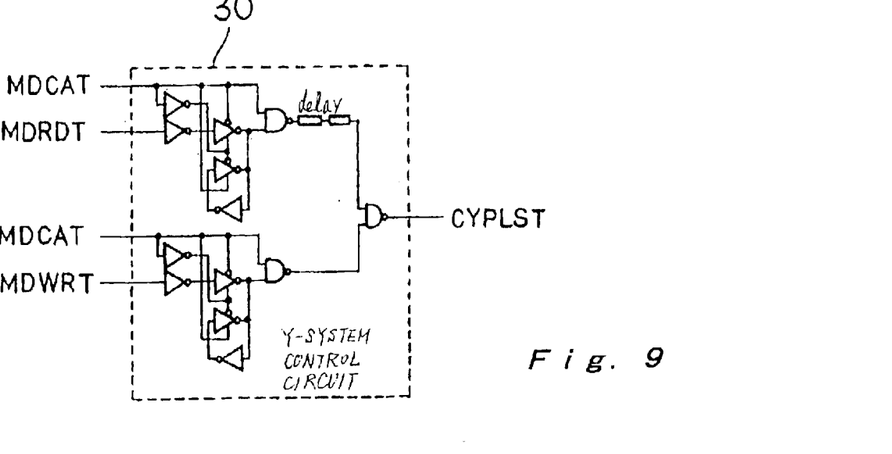
FIG. 9 is a circuit diagram showing an example of the configuration of the Y-system control circuit that is shown in FIG. 7.

We now refer to FIG. 7, which is a block diagram showing an example of the construction of the semiconductor memory device of the present invention. FIG. 8 is a circuit diagram showing an example of the configuration of the first write-system control circuit, the second write-system control circuit, and the write amplifier that are shown in FIG. 7. FIG. 9 is a circuit diagram showing an example of the configuration of the Y-system control circuit that is shown in FIG. 7.

As shown in FIG. 7, the semiconductor memory device of the present invention is a construction that includes: memory unit 1 for storing data, peripheral circuit unit 2 for controlling the operation of writing data to and reading data from memory unit 1, and internal voltage generation circuit 3 for generating various power supply voltages that are supplied to memory unit 1 and peripheral circuit unit 2.

Memory unit 1 is a construction that includes: memory cell array 11 that is made up from a plurality of memory cells that are arranged in a lattice form, sense amplifier 12 and read amplifier 13 for reading data that are stored in the memory cells, write amplifier 14 for writing data to memory cells, and Y-decoder 15 and X-decoder 16 for decoding address signals for accessing memory cells for writing and reading data. Sense amplifier 12 is further provided with switches (not shown in the figure) for connecting write amplifier 14 and read amplifier 13 with each of the bit lines BL of memory cell array 11.

Peripheral circuit unit 2 is a construction that includes: FIFO memory 21 for temporarily holding write data that are supplied to write amplifier 14 and FIFO memory 22 for temporarily holding read data that are supplied from read amplifier 13; timing generation circuit 23 for generating various timing signals from system clock CLK that is supplied from the outside for causing the semiconductor memory device to operate at a prescribed timing; command decoder 24 for decoding various control commands that are supplied from the outside for setting the semiconductor memory device to prescribed operation modes; read-system control circuit 25 for controlling the operations of reading data from memory cell array 11 in accordance with the output signals of timing generation circuit 23 and command decoder 24; first write-system control circuit 26 for controlling the operations of write amplifier 14 in accordance with output signals of timing generation circuit 23 and command decoder 24; second write-system control circuit 27 for controlling the data output timing of FIFO memory 21 in accordance with the DQS signal and the output signal of command decoder 24; latch circuit 28 for temporarily holding address signals that are supplied from the outside; refresh counter 29 for controlling the refresh operation; Y-system control circuit 30 for controlling access to the Y-(column-) system of memory cell array 11 in accordance with the output signals of timing generation circuit 23 and command decoder 24; X-system control circuit 31 for controlling access to the X(row-) system of memory cell array 11 in accordance with output signals of timing generation circuit 23 and command decoder 24; predecoder remedy circuit 32 that is used in the Y-system for switching from a memory cell in which a defect has occurred to a spare memory cell; and predecoder remedy circuit 33 which is used in the X-system for switching from a memory cell in which a defect has occurred to a spare memory cell.

Peripheral circuit unit 2 is supplied with system clock CLK (/CLK), control commands (such as /RAS, /CAS, /WE, and /CS), and address signal Add by way of input circuits 341–343 respectively, these input circuits being buffer circuits. In addition, data (write data) that are to be written to memory cell array 11 are supplied to FIFO memory 21 by way of input circuit $34_4$, and data that are read from memory cell array 11 are supplied to the outside by way of output circuit $35_1$ which is a buffer circuit. Similarly, the DQS signal that is supplied from the outside is supplied to peripheral circuit unit 2 by way of input circuit $34_5$, and the DQS signal that is generated at read-system control circuit 25 is supplied to the outside by way of output circuit $35_2$.

As with the first to third prior-art examples, the semiconductor memory device of this embodiment is a prefetch memory, and although not shown in FIG. 7, FIFO memories 21 and 22 are therefore provided for each bit of write data and read data (such as 8, 16, or 32 bits), and write amplifiers 14 and read amplifiers 13 are provided in a number equal to the prefetch number (such as 2 or 4) for each bit of write data and read data. FIFO memories 21 and 22 are therefore connected with each of write amplifiers 14 and read amplifiers 13 by a number of GIO lines that is equal to the product of the number of bits of write data and read data and the prefetch number. In addition, write amplifiers 14 and read amplifiers 13 are connected to memory cell array 11 by a number of LIO lines that is equal to the product of the number of bits of write data and read data and the prefetch number.

As shown in FIG. 8, first write-system control circuit 26 and second write-system control circuit 27 are each made up from logic gates.

Based on write command MDWRT that is generated at command decoder 24, first write-system control circuit 26 generates a gate signal for causing a write voltage that corresponds to the write data to be supplied, as output from write amplifier 14 in synchronization with system clock CLK.

Second write-system control circuit 27 generates a gate signal for causing write data that are held at FIFO memory 21 to be transmitted to write amplifier 14 in synchronization with the DQS signal.

Of the plurality of FIFO memories 21 and write amplifiers 14, FIG. 8 shows only the circuits that are used for processing a one-bit portion of write data. Further, FIG. 8 shows a construction that omits the serial/parallel conversion circuit for converting write data that have been received as burst input to the prefetch number of items of parallel data.

As shown in FIG. 9, Y-system control circuit 30 is a construction that includes a latch circuit for temporarily holding an input signal, a delay circuit for delaying the signal by a prescribed time interval, and a plurality of logic gates.

MDCAT shown in FIG. 9 is a timing signal that is supplied from timing generation circuit 23 for determining the operation timing of the column system (Y-system). MDRDT shown in FIG. 9 is a read command that is supplied from command decoder 24, and MDWRT is a write command that is supplied from command decoder 24. CYPLST shown in FIG. 9 is a control signal that is supplied from Y-system control circuit 30 to Y-decoder 15 by way of predecoder remedy circuit 32.

In the Y-system control circuit 30 of the present embodiment, due consideration is given to tRCDmin (the time interval from the input of an active command until a read command MDRDT or write command MDWRT can be accepted) as in the prior art when reading data, and control signal CYPLST is supplied as output after being delayed by a prescribed time interval from the reception of timing signal MDCAT. When writing data, on the other hand, control signal CYPLST is supplied as output without being delayed from the reception of timing signal MDCAT. When reading data, Y-system control circuit 30 is supplied with timing signal MDCAT that is generated at timing generation circuit 23 after having been supplied with read command MDRDT that is generated at command decoder 24. When writing data, on the other hand, after Y-system control circuit 30 has been supplied with write command MDWRT that has been generated at command decoder 24, Y-system control circuit 30 is supplied from timing generation circuit 23 with timing signal MDCAT in synchronization with the DQS signal that is received as input together with, of the write data that have been received as burst input, the final item of write data of every prefetch number of items of write data.

Generally, when writing data, the write latency and the time for input of the write data are required from the time of setting to the write mode until the write data are actually written to the memory cells (in the present embodiment, three or more cycles of system clock CLK). Control signal CYPLST is thus preferably supplied as output without giving consideration to tRCDmin as when reading data and without delaying the signal from timing signal MDCAT.

In the semiconductor memory device of the above-described first prior-art example, however, the data writing operations, which include the operation of transmitting data from the FIFO memory to the write amplifier, are all controlled in synchronization with system clock CLK, and the interval from the transmission of write data to a write amplifier until the supply of control signal CYPLST as output as shown in FIG. 2 therefore becomes shorter. As a result, supplying control signal CYPLST as output without delaying from timing signal MDCAT results in the possibility that the write amplifier will operate before the input data has been established. In other words, in the construction of the first prior-art example, outputting control signal CYPLST without delaying the control signal from timing signal MDCAT introduces the danger of destruction of the write data.

The semiconductor memory device of the second prior-art example is a construction in which the operation of reading data is controlled by system clock CLK and the operation of writing data is controlled by the DQS signal; and this semiconductor memory device is therefore a construction in which control signal CYPLST is delayed by a prescribed time interval with respect to timing signal MDCAT when writing data, a construction in which Y-system control circuit 30 shown in FIG. 9 cannot be applied, and a construction that cannot be a subject for comparison. In addition, the control method when reading data in the semiconductor memory device of the third prior-art example is not clear, and as a result, as with the second prior-art example, this semiconductor memory device is of a construction in which Y-system control circuit 30 that is shown in FIG. 9 cannot be applied and which cannot serve as an object of comparison.

In the present embodiment, as will be explained hereinbelow, write data are transmitted from FIFO memory 21 to write amplifier 14 in synchronization with the DQS signal, and the write data are thus transmitted to write amplifiers tDS sooner than in the first prior-art example. Accordingly, the time required for establishing input data in write amplifier 14 can be adequately secured even if control signal CYPLST is supplied as output without delaying the control signal from timing signal MDCAT.

The above-described form of the present embodiment allows the elimination of the delay of control signal CYPLST when writing data, whereby the output timing of activation signal YS and the output timing of write data from write amplifier 14 can each be made earlier than in the first prior-art example and second prior-art example.

Figure 10:
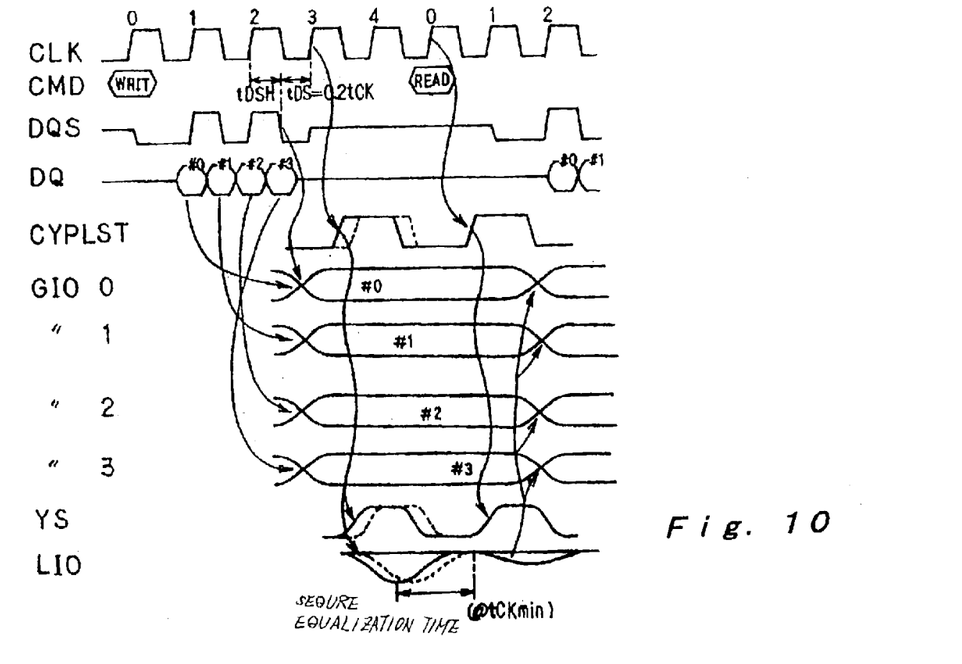
FIG. 10 is a timing chart showing the operation of the semiconductor memory device that is shown in FIG. 7.

We next refer to the timing chart of FIG. 10 to explain the operations for writing and reading data in the semiconductor memory device shown in FIG. 7. FIG. 10 shows data writing and reading operations in which the write latency WL is 1, the read latency RL is 2, the burst length is 4, and the prefetch number is 4. In addition, the broken lines in each of control signal CYPLST, activation signal YS, and LIO show the waveform when the control method of the semiconductor memory device of the present invention is not used (when control signal CYPLST is not delayed with respect to timing signal MDCAT).

The semiconductor memory device of the present embodiment is a construction that controls data transfer from FIFO memory 21 to write amplifier 14 by means of the DQS signal and controls the transfer of data to memory cell array 11 from Y-system control circuit 30 and write amplifier 14 by means of system clock CLK.

When writing data to the semiconductor memory device shown in FIG. 7, each data bit of the plurality of items of write data (DQ) that are successively received in synchronization with the rising edge and the falling edge of the DQS signal as shown in FIG. 10 are both converted to parallel data and held temporarily at FIFO memory 21. Then, in accordance with the control signal that is generated at second write-system control circuit 27, the items of write data are each transmitted (GIO) to write amplifier 14 at the falling edge of the DQS signal that is received as input together with, of the write data that is received as burst input by one write command, the final item of write data of every prefetch number of items.

Because each data bit of a prefetch number portion of write data is transmitted in parallel from FIFO memory 21 to write amplifier 14 at this time in the present embodiment, there is no need for high-speed data transfer by way of GIO lines that bear a heavy load as in the third prior-art example, and the write data can therefore be reliably transmitted from FIFO memory 21 to write amplifier 14.

When the semiconductor memory device is set to the write mode (WRIT) by a control command from the outside, a write command that instructs data writing that is generated at command decoder 24 is supplied to Y-system control circuit 30. At the same time, timing signal MDCAT that is generated at timing generation circuit 23 is supplied to Y-system control circuit 30 at, for example, the rising edge of the system clock CLK of the next cycle (CLK=3 in FIG. 10) following completion of the input of the prefetch number of items of write data. The timing of the supply of timing signal MDCAT to Y-system control circuit 30 does not need to be the rising edge of the system clock CLK of the next cycle following completion of the input of the prefetch number of items of write data, but may also be the rising (or falling) edge after a prescribed cycle of system clock CLK following completion of the input of the prefetch number of items of write data.

Y-system control circuit 30 supplies control signal CTPLST for controlling switches (not shown in the figure) inside sense amplifier 12 based on timing signal MDCAT in order to connect write amplifier 14 that corresponds to a write address with bit lines BL. In the present embodiment, control signal CYPLST is supplied without being delayed with respect to timing signal MDCAT at this time, as described in the foregoing explanation. Control signal CYPLST is also employed in the predecoding process and defective memory cell remedy process by predecoder remedy circuit 32.

In accordance with control signal CYPLST that is transmitted from Y-system control circuit 30 by way of predecoder remedy circuit 32, Y-decoder 15 supplies activation signal YS as output for turning on each of the switches inside sense amplifier 12 that correspond to the results of decoding the write address.

Based on the write data that have been transmitted from FIFO memory 21, write amplifier 14 supplies as output (LIO) the write voltage, which is the voltage that is necessary for writing data to memory cells, in synchronization with the control signal that is generated at first write-system control circuit 26. The write voltage that is supplied from write amplifier 14 is supplied by way of the switches in sense amplifier 12 to each of bit lines BL in memory cell array 11, and write data are written to the memory cells that correspond to the decoding results.

On the other hand, when reading data from the semiconductor memory device shown in FIG. 7, the semiconductor memory device is set to the read mode (READ) by a control command from the outside, whereupon a read command that instructs data reading that is generated at command decoder 24 and a timing signal that is generated at timing generation circuit 23 are each supplied to Y-system control circuit 30 at the rising edge of system clock CLK.

In order to connect read amplifier 13 that corresponds to the read address with bit lines BL, Y-system control circuit 30 supplies control signal CYPLST as output for controlling the switches (not shown in the figure) inside sense amplifier 12 based on the above-described timing signal MDCAT. In the present embodiment, control signal CYPLST is delayed by a prescribed delay time from timing signal MDCAT and then supplied, as described in the foregoing explanation.

In accordance with control signal CYPLST that has been transmitted from Y-system control circuit 30 by way of predecoder remedy circuit 32, Y-decoder 15 supplies activation signal YS for turning on each of the switches in sense amplifier 12 that correspond to the results of decoding the read address.

Read amplifier 13 reads each item of data in memory cell array 11 that is detected by sense amplifier 12 in synchronization with a control signal that is generated by read-system control circuit 25 and transmits the read data to FIFO memory 22. FIFO memory 22 supplies the read data that have been transmitted from read amplifier 13 to the outside from output terminal DQ by way of output circuit 351.

As described in the foregoing explanation, controlling the transmission of write data from FIFO memory 21 to write amplifier 14 by the DQS signal in the semiconductor memory device of the present embodiment allows write data to be transmitted to write amplifier 14 at a speed that is sooner by tDS (the setup time interval of the DQS signal with respect to system clock CLK).

When writing data, the elimination of the delay of control signal CYPLST with respect to timing signal MDCAT and the acceleration of the output timing of activation signal YS and the write data from write amplifier 14 as shown by the solid line in FIG. 10 enables the equalization time of LIO lines to be secured after writing data. The present embodiment therefore allows data to be written at a higher speed than a semiconductor memory device of the prior art.

In addition, since write commands and read commands are each controlled in synchronization with system clock CLK, activation signal YS that is supplied in accordance with a write command can be easily halted by the read command even when a transition to a data reading operation occurs immediately following a data writing operation. Collisions between control signals for writing data and control signals for reading data can thus be eliminated even when a transition to a data reading operation occurs immediately after a data writing operation, and data can therefore be read reliably.

Finally, in the semiconductor memory device of the present embodiment, write data that have been received in a series (burst input) are converted to parallel data at FIFO memory 21 and the data bits of each item of write data are then each individually transmitted to write amplifier 14 by way of GIO lines, whereby write data can be reliably transmitted to write amplifier 14 even when the frequency of the system clock CLK is high. As a result, the present embodiment can prevent malfunctions and destruction of write data when writing data.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device in which operations for writing and reading data are controlled by using a system clock that is supplied from the outside and a data strobe signal that is received as input and supplied as output in synchronization with said data; said semiconductor memory device comprising:

a plurality of FIFO memories for temporarily holding write data, which are received as input from the outside and which are the object of writing;

a plurality of write amplifiers for writing said write data to memory cells that correspond to addresses that are received as input from the outside;

a first write-system control circuit for generating a first control signal for causing said write data to be transmitted from said FIFO memories to said write amplifiers in synchronization with said data strobe signal that is received together with, of said write data that have been received as burst input for one write command, the final item of write data of every prefetch number of items of write data;

a Y-system control circuit for generating a second control signal for driving a plurality of switches, which connect said write amplifiers with bit lines that connect to memory cells that correspond to addresses to which said write data are written, in synchronization with, of said system clock, the pulse edge of a prescribed cycle following completion of input of said final item of write data; and a second write-system control circuit for generating a third control signal for causing a write voltage, which is a voltage that is required for writing data to said memory cells, to be supplied as output from said write amplifiers based on said write data in synchronization with, of said system clock, the pulse edge after a prescribed cycle following the completion of input of said final item of write data.

2. The semiconductor memory device according to claim 1, wherein said FIFO memories comprise:

a serial-parallel conversion circuit for supplying said write data, which have been received as said burst input, as parallel output in units of said prefetch number.

3. The semiconductor memory device according to claim 1, wherein said Y-system control circuit:

upon receiving a read command for reading data that have been stored in said memory cells, delays said second control signal a prescribed time interval from a timing signal that is synchronized with said system clock and supplies said second control signal as output; and upon receiving a write command for writing said write data to said memory cells, supplies said second control signal as output without delaying said second control signal from a timing signal that is synchronized with said system clock.

4. A control method of a semiconductor memory device, said semiconductor memory device being provided with: a plurality of FIFO memories for temporarily holding write data, which are data that are received as input from the outside and which are the object of writing; and a plurality of write amplifiers for writing said write data to memory cells that correspond to addresses that are received as input from the outside; and said semiconductor memory device using a system clock that is supplied from the outside and a data strobe signal that is received as input and supplied as output in synchronization with data to control the operations of writing and reading said data; said control method comprising the steps of:

transferring said write data from said FIFO memories to said write amplifiers in synchronization with said data strobe signal that is received as input together with, of write data that are received as burst input for one write command, the final item of write data of a prefetch number of items of write data;

driving a plurality of switches for connecting said write amplifiers with bit lines, which are connected to memory cells that correspond to addresses to which said write data are to be written, in synchronization with, of said system clock, a pulse edge after a prescribed cycle following completion of input of said final item of write data; and supplying write voltage, which is the voltage required for writing data to said memory cells, from said write amplifiers based on said write data.

5. The control method of a semiconductor memory device according to claim 4, wherein said write data that have been received as burst input are transmitted from said FIFO memories to said write amplifiers in parallel in units of said prefetch number.

6. The control method of a semiconductor memory device according to claim 4; wherein:

when a read command for reading data that are stored in said memory cells is issued, said switches are driven after delaying a prescribed time interval from a timing signal that is synchronized with said system clock; and when a write command is issued for writing said write data to said memory cells, said switches are driven without delaying from a timing signal that is synchronized with said system clock.

* * * * *